(12) United States Patent
Loopstra

(10) Patent No.: US 6,208,407 B1
(45) Date of Patent: Mar. 27, 2001

(54) METHOD AND APPARATUS FOR REPETITIVELY PROJECTING A MASK PATTERN ON A SUBSTRATE, USING A TIME-SAVING HEIGHT MEASUREMENT

(75) Inventor: Erik R. Loopstra, Heeze (NL)

(73) Assignee: ASM Lithography B.V., Veldhoven (NL)

( * ) Notice: Subject to any disclaimer, the term of this patent is extended or adjusted under 35 U.S.C. 154(b) by 0 days.

(21) Appl. No.: 09/114,748

(22) Filed: Jul. 13, 1998

(30) Foreign Application Priority Data

Dec. 22, 1997 (EP) .................................. 97204054

(51) Int. Cl.$^7$ .......................... G03B 27/42; G03B 27/52; G01B 11/00
(52) U.S. Cl. .............................. 355/53; 355/55; 350/399; 350/400
(58) Field of Search ................................. 355/53, 67, 40, 355/55; 356/399, 400, 401; 250/548

(56) References Cited

U.S. PATENT DOCUMENTS

| | | | |
|---|---|---|---|
| 4,999,669 | * | 3/1991 | Sakamoto et al. .................. 355/53 |
| 5,416,562 | * | 5/1995 | Ota et al. ........................ 355/53 |
| 5,917,580 | * | 6/1999 | Ebinuma et al. ................... 355/53 |

FOREIGN PATENT DOCUMENTS

| | | |
|---|---|---|
| 0 077 878 | 5/1983 | (EP) . |
| 0 687 957 | 12/1995 | (EP) . |
| 0793073 | 9/1997 | (EP) . |
| 57-183031 | 11/1982 | (JP) . |
| 61-196532 | 8/1986 | (JP) . |

* cited by examiner

Primary Examiner—Russell Adams
Assistant Examiner—Peter B. Kim
(74) Attorney, Agent, or Firm—Pillsbury Madison & Sutro LLP

(57) ABSTRACT

In a lithographic projection apparatus, a time-saving height measurement method is used. While in a projection station (105,108,111) the pattern of a mask (129) is projected on the fields of a first substrate (120), the height of the fields of a second substrate (121) is measured in a measuring station (133). In the measuring station, the height of the substrate fields and the height of the substrate holder (113) are measured by a first height sensor (150) and a second height sensor (160), respectively, and the value of the height of the substrate holder associated with the ideal height of the substrate field is determined for each substrate field. In the projection station, only the height of the substrate holder (111) is controlled by a third height sensor (180). The second and third height sensors are preferably part of a composite XY interferometer system extended with a Z measuring axis.

19 Claims, 9 Drawing Sheets

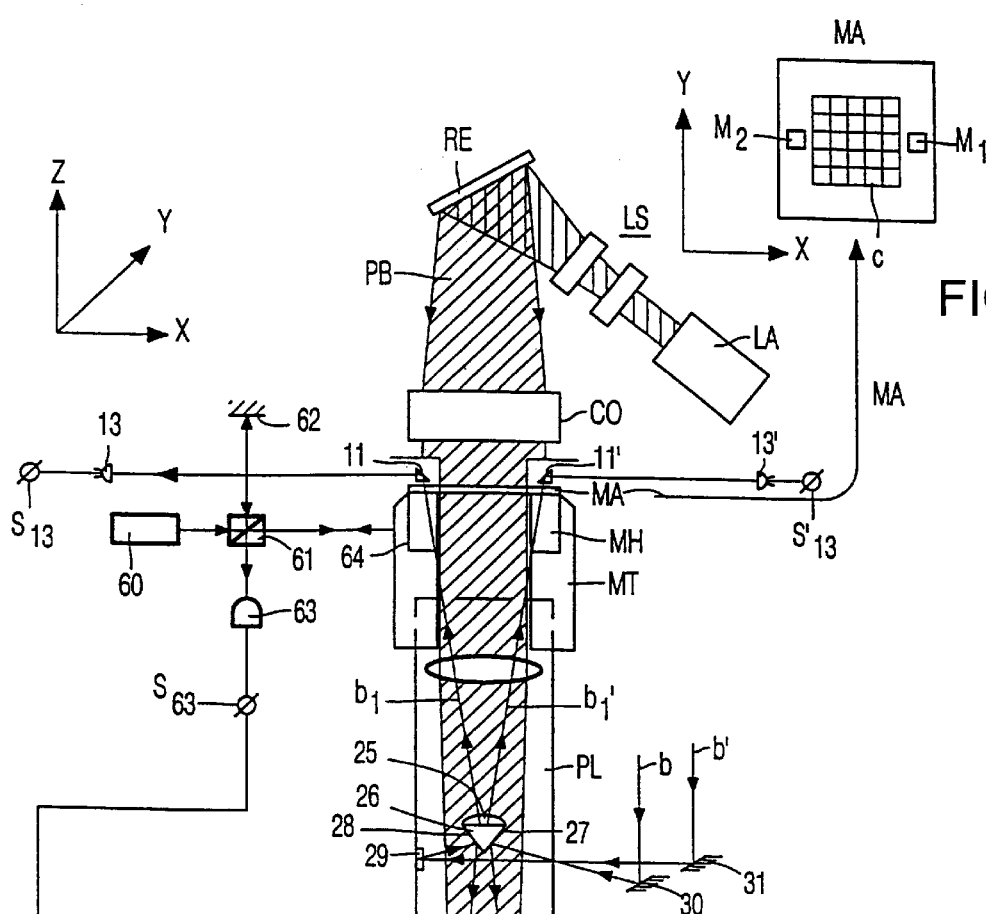
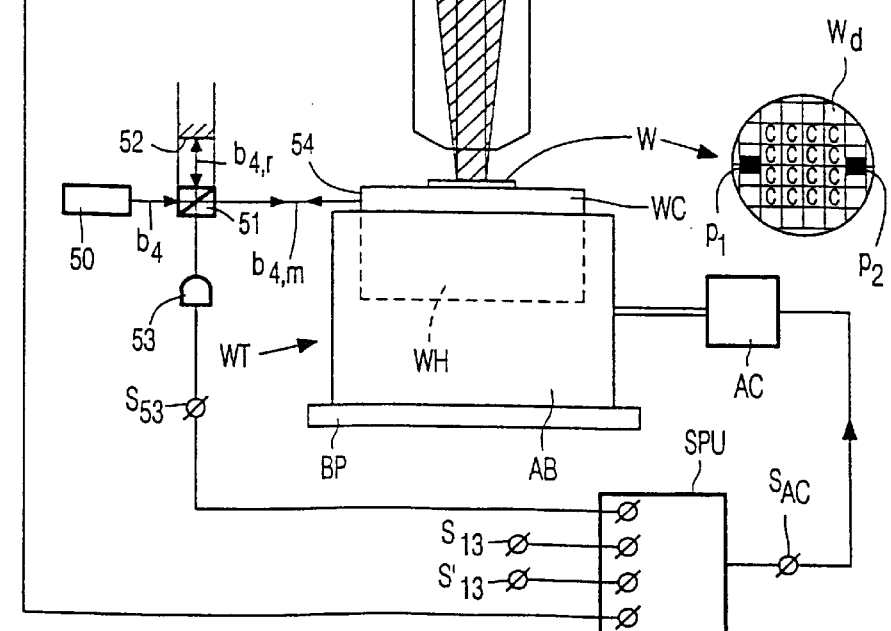
FIG. 1A
FIG. 1B
FIG. 1C

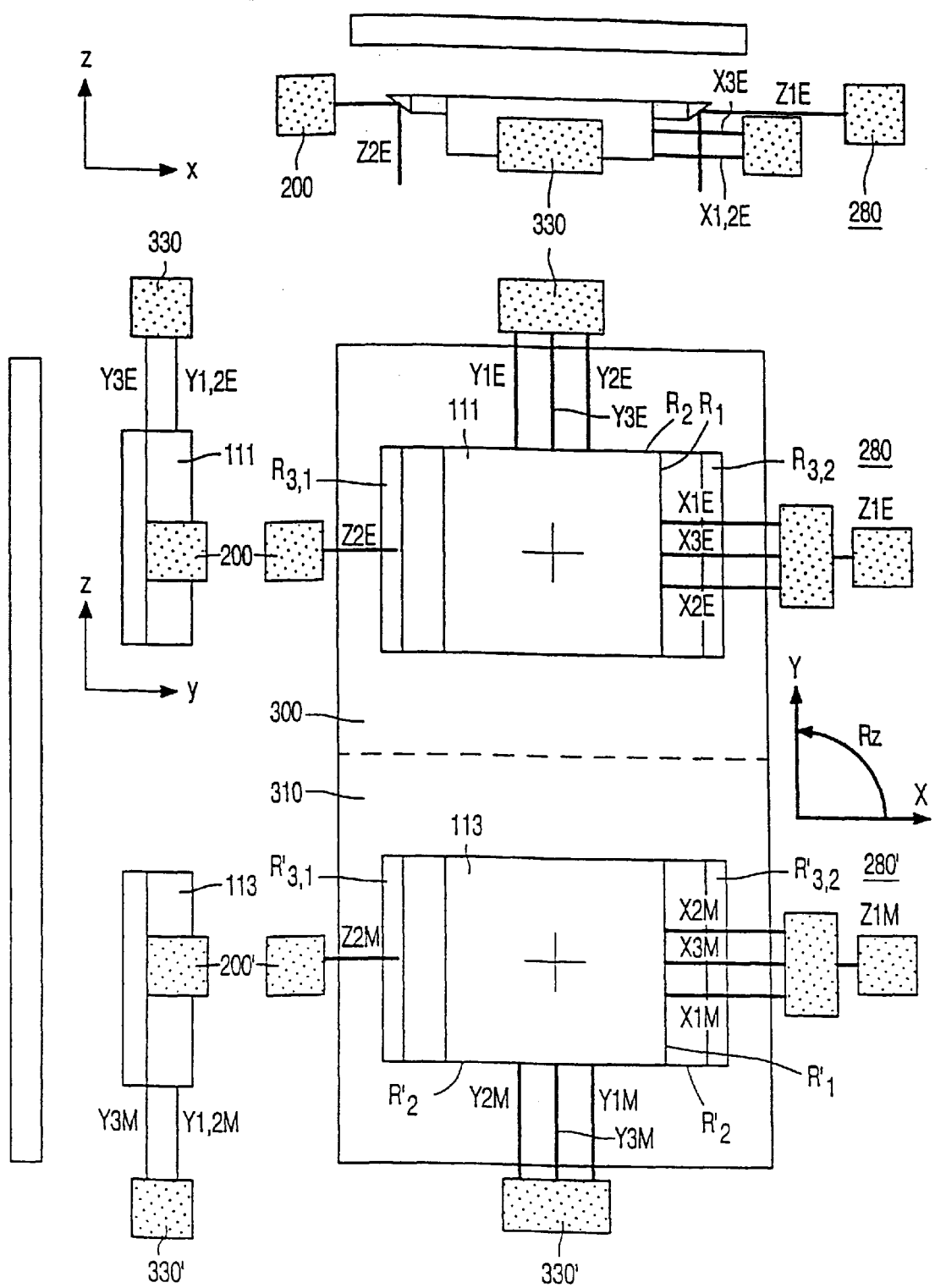

US 6,208,407 B1

METHOD AND APPARATUS FOR REPETITIVELY PROJECTING A MASK PATTERN ON A SUBSTRATE, USING A TIME-SAVING HEIGHT MEASUREMENT

BACKGROUND OF THE INVENTION

1. Field of the Invention

The invention relates to a method of projecting a mask pattern on a plurality of fields of a substrate, having a radiation-sensitive layer, by means of a projection beam and a projection system, and wherein prior to introducing a substrate holder with the substrate into the projection beam and underneath the projection system, the surface profile of the substrate is determined, for each substrate field, by:

measuring the height in a direction parallel to the axis of the projection beam;

measuring the height of a reference plane of the substrate holder;

establishing a relation between the height of the substrate field and the height of the reference plane of the substrate holder, and storing this relation in a memory, and, after introducing the substrate holder with a substrate into the projection beam for illuminating each substrate field, the height of this field is adjusted by checking the height of the reference plane of the substrate holder.

The invention also relates to a product manufactured by means of the method and to a lithographic projection apparatus which is suitable for performing the method. This apparatus may be a stepper or a step-and-scanner.

2. Description of the Related Art

A method and apparatus of this type for manufacturing ICs is described in published Japanese patent application JP-A 61-196532. This patent application mentions the problem that, during the IC manufacturing process, the surface of the substrates may be deformed because these substrates undergo a thermal treatment between consecutive illuminations, each time with a different mask pattern. Due to such a deformation of the substrate surface, IC areas or fields of the substrate may get beyond the depth of focus of the projection lens system with which the mask pattern is imaged on the different substrate fields, so that no good images can be realized any longer. It is therefore necessary to measure the height of each substrate field, i.e. the position along an axis parallel to the optical axis of the projection lens system. If a height measurement is performed at a point for each substrate field, a possible unevenness of the relevant substrate field cannot be measured and it cannot be ensured that the entire substrate field is within the depth of focus of the projection lens system.

The object of JP-A 61-196532 is to provide a method with which it can be ensured that the entire substrate field surface is within the depth of focus and with which it can be ascertained whether this surface has a quality which is too bad to be illuminated or should not be used at all. To realize this object, JP-A 61-196532 proposes to measure the height and possible tilt of the fields of the substrates before they are introduced into the projection beam and underneath the projection lens system, hence in a projection station. This measurement is performed in a separate measuring station.

An important parameter of the current lithographic apparatuses is the throughput, i.e. the number of substrates which can be illuminated per unit of time by the apparatus, hence provided with images of the mask pattern. As is known, there is a very rapid development in the field of lithographic apparatuses. After the publication of JP-A 61-196532, more generations of these apparatuses have meanwhile succeeded each other. With the successive generations, ICs having an increasing number of electronic components could be manufactured. However, this meant that the procedures for aligning (in an X and Y direction perpendicular to the axis of the projection system) of the substrate fields with respect to the mask pattern and for keeping these fields in focus became more difficult and more time-consuming. During this alignment, not only an alignment system in which alignment marks of the substrate are imaged on the marks of the mask and which is described in, for example U.S. Pat. No. 4,778,275, but also an interferometer system is used with which the X and Y movements of the substrate and the positions of the substrate fields can be fixed in a system of co-ordinates.

An important breakthrough was the use of an interferometer system with at least five instead of three measuring axes. A lithographic apparatus provided with such an interferometer system is described in EP-A 0 498 499. With this interferometer system, not only the displacements of the substrate along the X axis and the Y axis and the rotation about the Z axis can be measured, but also the tilt about the X axis and the tilt about the Y axis can be measured very accurately. Consequently, each substrate field can be positioned with sufficient accuracy with respect to the mask pattern without separate alignments having to be performed per substrate field. The time required for illuminating the substrate can thus be reduced considerably.

In JP-A 61-196532, a separate measuring station is used for measuring the height and the tilt of the substrate fields. It is further remarked that, due to the use of a plurality of substrate holders, the illumination of a first substrate and the measurement on a second substrate can be performed simultaneously so that the same throughput as in known apparatuses can be achieved. The reason behind this is that, due to the various and extra measuring steps to be performed per substrate field, the time required for illuminating the entire substrate would become too long if the apparatus treated substrate by substrate, i.e. first consecutively measuring and illuminating a first substrate, subsequently consecutively measuring and illuminating a second substrate, and so forth. However, due to the facilities provided by the interferometer system with at least five measuring axes, the problem and solution mentioned in JP-A 61-196532 have been superseded, and the accuracy aimed at can also be achieved without a separate measuring station and without a parallel-time measurement and illumination.

For the novel lithographic apparatuses and the lithographic apparatuses which are currently being developed, with which even smaller details must be imaged and an even greater positioning accuracy of the substrate fields is desirable, it is necessary to align per substrate field and to perform a focus and tilt correction despite the use of an interferometer system with five or more measuring axes.

It has already been proposed, for example in EP-A 0 687 957 and the English-language abstract of JP-A 57-183031 to provide a lithographic projection apparatus with at least two substrate holders and a separate alignment station. In this station, the substrates are aligned with respect to the substrate holder on which they are present, prior to their introduction into the projection station. In the projection station, only the substrate holder is then to be aligned with respect to the mask pattern, which is a relatively simple process which can be performed rapidly. Since two substrate holders are used, which can be moved between the alignment station and the projection station, a second substrate can be aligned with respect to the substrate support in the alignment station while a first substrate is being illuminated in the projection station, and the time required for alignment in the projection station can be minimized.

In the height-measuring station described in JP-A 61-196532, the same multiple height sensor consisting of, for example three air sensors is used for measuring the height of both a substrate field and a reference plane of the substrate holder. Furthermore, a shearing interferometer system is provided for measuring the shape of the substrate field surface. The result of this choice of measuring devices is that the measuring procedure comprises a relatively large number of steps.

First, the height of the substrate field is measured at three different positions in this field by means of the three air sensors, so that the slope of this field can be computed. This slope is referred to as "temporary base plane". Subsequently, it is ensured by means of a vertical actuator which is present in the height-measuring station that the temporary base plane is parallel to a reference plane of the interferometer. Then, the air sensors of the substrate surface are moved to the reference plane of the substrate holder. Subsequently, the substrate field is measured with the interferometer, while the shape of the substrate field surface is computed from the interference pattern formed in the interferometer system. During this step the substrate must be moved vertically over small distances by the vertical actuator. Subsequently, the height of the substrate support reference plane is measured with the three air sensors. Finally, the correlation between this height and the temporary base plane is determined. The information thus obtained is sent to the projection station where it is used, after arrival of the relevant substrate, for adjusting the height of the substrate fields, at which only the height of the substrate reference plane is measured with three air sensors which are present in the projection station.

SUMMARY OF THE INVENTION

It is an object of the present invention to provide a method of the type described in the opening paragraph which is based on a different concept and is simpler than that described in JP-A 61-196532. The method according to the invention is characterized in that, in the measurement of the height of each substrate field, said field and a first height sensor are moved with respect to each other in a plane perpendicular to the axis of the projection beam, a second height sensor is used for measuring the height of the substrate support reference plane, the height of the substrate support reference plane associated with the ideal height of the relevant substrate field is subsequently computed and stored, and, after the substrate has been introduced into the projection beam, only the value of this height for each substrate field is checked by means of a third height sensor.

The axis of the projection beam is understood to mean the symmetry axis of the projection radiation. This radiation may consist of a single beam with a round crosssection or an annular cross-section or a cross-section in the form of a circular segment. The projection radiation may alternatively consist of, for example four sub-beams which are arranged in four quadrants and have for their object to increase the resolving power of the projection apparatus. The symmetry axis is then an axis through the center of the four quadrants. A projection beam with a cross-section in the form of a circular segment at the area of the mask plane is used in a step-and-scanner. In the latter case, the symmetry axis is an axis through the center of curvature of the circle.

The invention is based on the recognition that the height and the profile of the substrate field can be measured in a considerably simpler way and within a shorter period of time as compared with the method described in JP-A 61-196532 by using a single height sensor for measuring the substrate field and by moving this field and the height sensor with respect to each other in a plane perpendicular to the measuring direction, at which the height sensor each time measures only a small portion of the substrate field. Since furthermore a second height sensor is used for measuring the substrate support reference plane, the first height sensor no longer needs to be displaced from the substrate field to the reference plane, and vice versa, which increases the stability of the measuring device and enhances the measurement.

The method according to the invention is preferably further characterized in that, for each substrate field, the height of this substrate field and the height of the substrate holder reference plane are measured simultaneously.

This is made possible because two height sensors are used in the measuring station so that the measuring time is shorter.

A preferred embodiment of the method is further characterized in that, both before and after introducing the substrate holder with the substrate into the projection beam, and when measuring the height of the substrate holder reference plane, also the position of the substrate is measured along an X axis and an Y axis, the X axis and the Y axis being axes of a three-axis orthogonal system of co-ordinates, the Z axis of which is parallel to the axis of the projection beam.

Due to the X and Y measurement, which can be performed with the above-mentioned interferometer system, the position of a substrate field is measured in a system of co-ordinates determined by the interferometer system, simultaneously with the height of this substrate field. The result of this measurement may be used in the projection station, inter alia, for identifying the substrate field. Moreover, the combination of the Z measurement with the X and Y measurements enhances the reliability and accuracy of these measurements.

Since the X and Y positions of each substrate field are now determined both in the measuring station and in the projection station, a part of the alignment procedure required in lithography techniques can be performed before the substrate is introduced into the projection beam. An embodiment of the method for which this is the case is characterized in that, before introducing the substrate holder with the substrate into the projection beam, a relation is determined for each substrate field between an alignment mark associated with said substrate field and at least one reference mark on the substrate holder, and, after introducing the substrate holder with the substrate into the projection beam, each substrate field is aligned before it is illuminated, while using said relation and by aligning said reference mark with respect to a corresponding mark on the mask.

During illumination of a first substrate, the most time-consuming part of the alignment procedure can thus be performed on a second substrate, so that also the time required for alignment can be considerably shorter. Advantage is taken of the fact that the X and Y position measurements required for the alignment are already performed for the purpose of the height measurements of the substrate fields. The principle and advantages of performing a part of the alignment procedure before a substrate is introduced into the projection beam are described in EP-A 0 687 957 and in the English-language abstract of JP-A 57-183031.

By using the novel method, sharp images of the mask pattern in the substrate fields are obtained, so that the products, for example ICs, which are manufactured by means of the method have very well defined structures so that the invention is also embodied in these products.

The invention also relates to a lithographic projection apparatus suitable for performing the method according to the invention. This apparatus, which comprises a projection station for projecting a mask pattern on a plurality of fields of a substrate arranged on a substrate holder, and a measuring station for measuring the height of each substrate field and the height of a reference plane of the substrate holder, wherein the path of the substrate through the apparatus extends via the measuring station to the projection station, is characterized in that the measuring station accommodates a first and a second height sensor for measuring the height of the substrate fields and the substrate holder reference plane, respectively, and the projection station accommodates a third height sensor for measuring the height of the substrate holder reference plane.

This apparatus differs from the apparatus in accordance with JP-A 61-196532 in that the measuring station of the last-mentioned apparatus accommodates only one height sensor.

In the novel apparatus, various types of height sensors can be used, such as capacitive or pneumatic meters. Moreover, the height sensors may be of mutually different types. Preferably, however, the three height sensors are optical height sensors.

Optical height sensors are flexible in use, require few extra provisions in the apparatus and are very accurate and reliable.

A preferred embodiment of the projection apparatus is characterized in hat at least one of the second and third height sensors forms part of a separate composite XYZ interferometer system for measuring X and Y displacements and. positions of the substrate, and has a number of X and Y measuring axes, which number is at least equal to the number of substrate displacements to be determined interferometrically, said measuring axes co-operating with X and Y measuring mirrors arranged on the substrate holder, said interferometer system further having a Z measuring axis which co-operates with a Z measuring mirror which is arranged on the substrate holder at an acute angle to the XY plane, said Z measuring axis and Z measuring mirror, together with a Z reflector and a Z detector, constituting the height sensor.

A measuring axis of the interferometer system is understood to be an axis along which the position or the displacement in a given direction (X, Y or Z) of the substrate is measured. This measuring axis does not need to coincide with the chief ray of the measuring beam which is used for the relevant measurement. If the measuring beam is sent through the system twice and is reflected twice at substantially the same point by a measuring mirror, the measuring axis is situated between the chief ray of the measuring beam upon the first passage and the chief ray of this beam upon the second passage through the system.

As regards stability and accuracy, an XY interferometer system extended with a Z measuring axis is eminently suitable for use as a height sensor in a lithographic apparatus. The height measurement can then be realized with relatively few and simple means: extra beam splitters and an extra Z detector in the interferometer system, and an extra measuring mirror on the substrate holder. Moreover, it is not necessary to reserve a space between the projection system and the substrate for providing a height sensor. The height of the substrate is now determined with respect to a Z reflector which is connected to the projection system.

As already noted, it is of great advantage if also a part of the alignment procedure can take place in addition to a height measurement in the measuring station. An apparatus providing this facility is characterized in that the measuring station includes an optical alignment system which comprises elements for imaging alignment marks associated with the substrate fields, and at least one substrate holder alignment mark on a reference mark within the alignment system.

An alignment system for a measuring station which is only used for aligning a substrate on a substrate table is described in the above-mentioned JP-A 57-183031.

A preferred embodiment of the apparatus is characterized in that the Z measuring mirror for the interferometer system is arranged on the substrate holder at an angle of substantially 45° to the XY plane.

If the Z reflector is parallel to the XY plane, the Z measuring mirror may then have a minimal width because the Z measuring beam traverses the same path to and from the Z reflector.

The apparatus may be further characterized in that the Z measuring mirror for the interferometer system is constituted by a beveled portion of an X or Y measuring mirror.

A substrate holder side face which is suitable for this purpose is then divided into a straight portion and a beveled portion at an angle of preferably 45° to the straight portion, and both portions are reflective.

A preferred embodiment of the apparatus is characterized in that the Z measuring mirror for the interferometer system is constituted by a beveled bar arranged on a side face of the substrate holder on which also an X or Y measuring mirror is arranged, said bar extending in the Z direction through only a small part of said side face and, in the direction perpendicular thereto, throughout the side face.

Since the Z reflector is arranged against the holder of the projection system, there will be a given distance, for example of the order of 70 mm, between one end of this reflector and the axis of the projection system in a lithographic apparatus. In order that, also in an extreme X position of the substrate holder, the measuring beam reflected by the Z measuring mirror can reach the Z reflector, the distance between the axis of the projection system and the center of the Z measuring mirror must be minimally equal to said distance in this extreme position. This means that the substrate holder would have to be enlarged for the purpose of the Z measurement. Since this holder must have a given height, also because the X or Y measuring mirror must also be provided on the side face on which the Z measuring mirror is provided, an enlargement of the substrate holder for the purpose of the Z measuring mirror would considerably increase its weight. By providing the Z measuring mirror on a thin bar which is rigidly connected to the substrate holder, the weight of this holder can remain limited.

In accordance with a further characteristic feature of the lithographic apparatus, the Z measuring mirror is preferably arranged on the part of the substrate holder remote from the substrate.

By placing the Z measuring mirror on the lower side of the holder and the X or Y measuring mirror above it, the risk of dynamic Abbe errors in the X and Y directions can be reduced. Moreover, a maximal portion of the relevant side face of the substrate holder and a maximal space between the Z measuring mirror and the projection system are then suitable for other measurements.

A separate reference mirror for the reference beam associated with the Z measuring beam may be arranged in the interferometer system. The Z detector which receives the Z measuring beam and the Z reference beam then supplies a signal in which the information about the Z position is mixed with information about the X position if the Z measuring mirror is arranged on the same side face of the substrate holder as the X measuring mirror, or with information about the Y position if the Z measuring mirror is arranged on the same side face as the Y measuring mirror. An electronic differentiation with the X position signal, or with the Y position signal, must then still be performed on this signal, i.e. this signal must be combined with the X position, or Y position, signal to obtain the pure Z position.

Preferably, however, the apparatus is further characterized in that the reference mirror for the reference beam associated with the Z measuring beam is constituted by an X or Y measuring mirror which is arranged on that side face of the substrate holder on which also the Z measuring mirror is arranged.

An optical differentiation is then performed, and the output signal of the Z detector comprises pure Z position information. It is not necessary to perform an electronic differentiation. The optical differentiation has the advantage that one is no longer dependent on the processing speed of the electronic circuits associated with the interferometer system.

For the Z measuring axis, a beam splitter must combine the measuring beam and the associated reference beam, after they have been reflected by the measuring mirror and the reference mirror, respectively, such that the radiation spots formed by these beams in the plane of the Z detector coincide as satisfactorily as possible. The signal supplied by this detector then has a maximal amplitude. However, these radiation spots may be offset with respect to the detector due to an unwanted tilt of the measuring mirrors associated with these beams, so that the directions of these beams vary. This phenomenon is known as "beam walk-off". Since the Z measuring beam is reflected by the Z measuring mirror as well as by the Z reflector, the beam walk-off for the Z measuring beam is larger than that for the Z reference beam. If use is made of the above-mentioned optical differentiation method, i.e. if the Z reference beam is sent to an X or Y measuring mirror, the beam walk-off can be reduced. In fact, the beam walk-off then varies in the same direction for both beams. The optical differentiation method thus provides a second advantage.

To further reduce the beam walk-off, the apparatus is preferably further characterized in that the path of the Z measuring beam incorporates a retroreflector by which the Z measuring beam reflected by the measuring mirror and directed to the detector is reflected to said measuring mirror for further reflection on said mirror.

Due to this extra reflection of the Z measuring beam on the measuring mirror, the original direction of the measuring beam is maintained, independent of a tilt of the mirrors which are present in the path of this beam.

The number of X and Y measuring axes of the interferometer system may be different, dependent on the presence of other measuring systems in the apparatus. However, in addition to a Z measuring axis, the interferometer system preferably comprises at least five further measuring axes.

In this system, the advantage of a maximal measuring accuracy is combined with that of an extra measuring facility, namely the Z measurement.

To render the interferometric measurements independent of variations of the refractive index of the medium in which the measuring beams propagate, the interferometer system may be further characterized in that the system has a measuring axis along which two measuring beams of different wavelengths propagate.

Since the same distance is measured with two beams of different wavelengths, and the refractive index of a medium is dependent on the wavelength of this measuring beam, a possible refractive index variation can be measured, and the measuring results of the interferometer system can be corrected therewith. Said measuring axis may be a separate reference measuring axis or one of the other measuring axes.

The lithographic apparatus is preferably further characterized in that, with the exception of the measuring mirrors, the components of the projection station-interferometer system as well as the Z reflector are arranged in a rigid frame in which also a projection system is rigidly secured, which frame is suspended dynamically isolated from the other components of the apparatus.

This measure considerably contributes to the realization of the desired measuring accuracy. The interferometer units are rigidly coupled free from disturbances to the projection system. Since said frame, also referred to as metrology frame, is suspended dynamically isolated, or free from vibrations, in the apparatus, the positions of the interferometer units present in this apparatus are no longer affected by external forces such as the drive forces for the substrate table of which the substrate holder forms part, and for the mask table of which the mask holder forms part.

The apparatus may be further characterized in that the reference mirrors for the reference beams associated with the X and Y measuring beams are arranged on the holder of the projection system.

The X and Y positions of the substrate are then no longer measured with respect to interferometer elements but with respect to the projection system. Possible deformations of the metrology frame then have a negligibly small influence on the position measurements.

These and other aspects of the invention are apparent from and will be elucidated with reference to the embodiments described hereinafter.

BRIEF DESCRIPTION OF THE DRAWING

In the drawings:

FIG. 1A shows an embodiment of a projection station of a lithographic projection apparatus;

FIG. 1B shows the mask MA of FIG. 1A in the XY plane;

FIG. 1C shows the substrate W of FIG. 1A in the XY plane;

FIGS. 9A–9C are a survey of the interferometer measurements which are performed in the measuring station and in the projection station.

DESCRIPTION OF THE PREFERRED EMBODIMENTS

Figure 2:
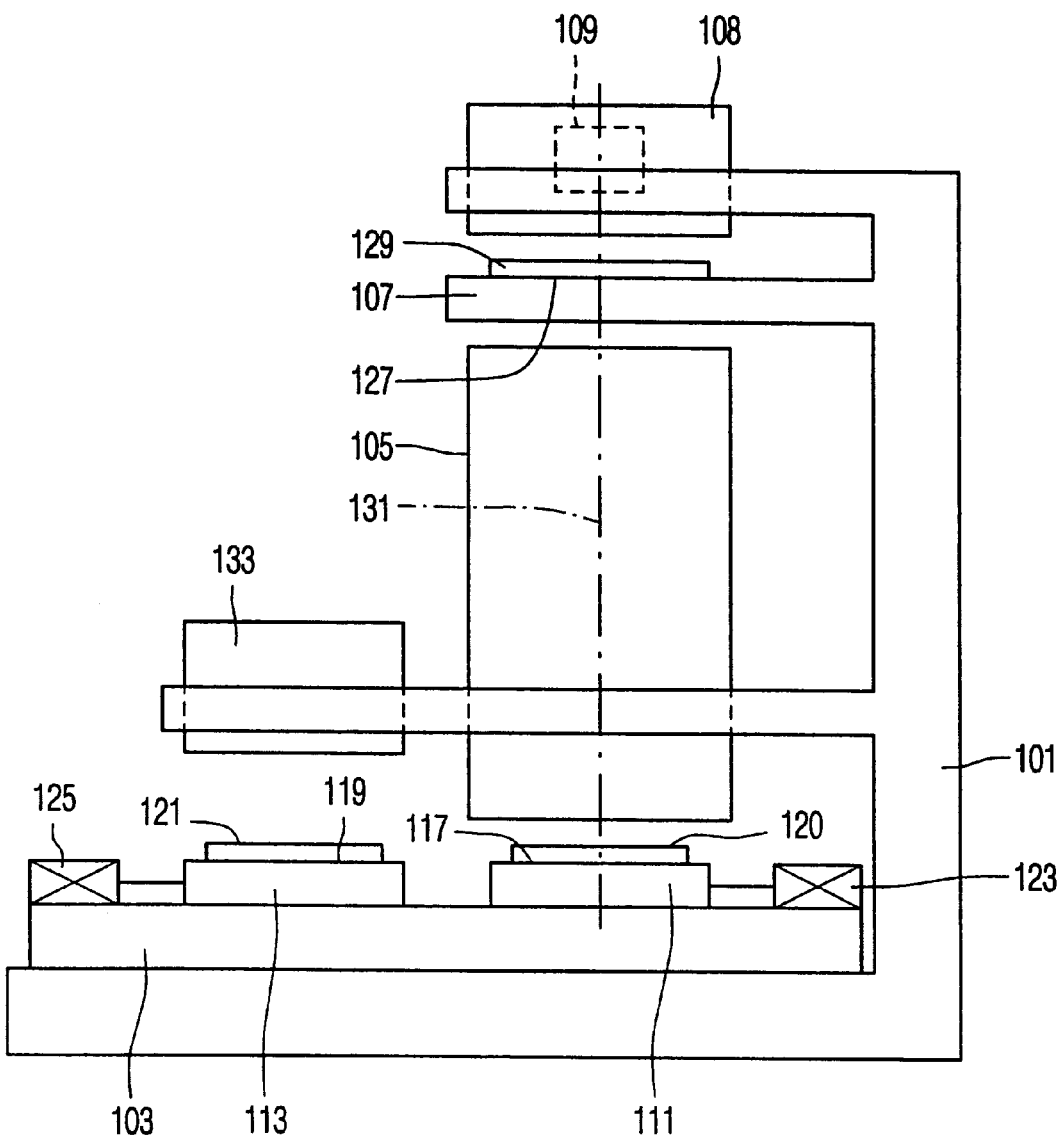
FIG. 2 shows the diagram of a lithographic projection apparatus with a separate height-measuring station and two substrate holders.

FIG. 1A shows diagrammatically the optical elements of an embodiment of a photolithographic apparatus for repetitively imaging a mask pattern on a substrate. The main component of this apparatus is a projection column accommodating a projection lens system PL. A mask holder MH for a mask MA, in which the mask pattern C to be imaged is provided, is arranged above this system. The mask holder is present in a mask table MT. A substrate table WT is arranged below the projection lens system PL. This table accommodates a substrate holder WH for a substrate W which is provided with a photosensitive layer and on which the mask pattern must be imaged a number of times, each time in a different IC area Wd. The substrate table is movable in the X and Y directions so that, after imaging of the mask pattern on an IC area, a subsequent IC area can be positioned underneath the mask pattern.

The apparatus further has an illumination system which comprises a radiation source LA, for example, a Krypton-Fluoride Excimer laser or a mercury lamp, a lens system LS a reflector RE and a condenser lens CO. The projection beam PB supplied by the illumination system illuminates the mask pattern C. This pattern is imaged by the projection lens system PL on an IC area of the substrate W. The illumination system may be alternatively implemented as described in EP-A 0 658 810. The projection lens system has a magnification of, for example, M=¼, a numerical aperture NA=0.6 and a diffraction limited image field having a diameter of 22 mm.

The apparatus further comprises a plurality of measuring systems, namely a system for aligning the mask MA with respect to the substrate W in the XY plane, an interferometer system for determining the X and Y positions and the orientation of the substrate holder and hence of the substrate, and a focus error detection system for determining a deviation between the focal or image plane of the projection lens system PL and the surface of the photosensitive layer on the substrate W. These measuring systems are parts of servo-systems which comprise electronic signal-processing and control circuits and drivers, or actuators, with which the position and orientation of the substrate and the focusing can be corrected with reference to the signals supplied by the measuring systems.

The alignment system uses two alignment marks $M_1$ and $M_2$ in the mask MA, indicated in FIG. 1B. These marks preferably consist of diffraction gratings, but they may be alternatively formed by other marks, such as squares or strips which are optically different from their surroundings. The alignment marks are preferably two-dimensional, i.e. they extend in two mutually perpendicular directions, the X and Y directions in FIG. 1B. The substrate W has at least two alignment marks, preferably also two dimensional diffraction gratings, two of which, $P_1$ and $P_2$, are shown in FIG. 1C. The marks $P_1$ and $P_2$ are located outside the area of the substrate W where the images of the pattern C must be formed. The grating marks $P_1$ and $P_2$ are preferably phase gratings and the grating marks $M_1$ and $M_2$ are preferably amplitude gratings.

FIGS. 1A–1C show a special embodiment of an alignment. system, namely a double alignment system in which two alignment beams b and b' are used for aligning the substrate alignment mark $P_2$ on the mask alignment mark $M_2$, and the substrate alignment mark $P_1$ on the mask alignment mark $M_1$, respectively. The beam b is reflected by a reflecting element 30, for example, a mirror to a reflecting surface 27 of a prism 26. The surface 27 reflects the beam b to the substrate alignment mark $P_2$ which passes a part of the radiation as beam $b_1$ to the associated mask alignment mark $M_2$ where an image of the mark $P_2$ is formed. A reflecting element 11, for example, a prism is arranged above the mark $M_2$, which prism directs the radiation passed by the mark $M_2$ towards a radiation-sensitive detector 13. The second alignment beam b' is reflected by a mirror 31 to a reflector 29 in the projection lens system PL. The reflector 29 passes the beam b' to a second reflecting surface 28 of the prism 26, which surface directs the beam b' onto the substrate alignment mark $P_1$. This mark reflects a part of the radiation of the beam b' as beam $b_1$' to the mask alignment mark $M_1$ where an image of the mark $P_1$ is formed. The radiation of the beam $b_1$, passing through the mark $M_1$ is directed towards a radiation-sensitive detector 13' by a reflector 11'. The operation of the double alignment system is described in U.S. Pat. No. 4,778,275, to which reference is made for further details of this system.

The embodiment of the alignment system according to FIGS. 1A–1C is particularly suitable for an apparatus in which the projection lens system PL is designed for a projection beam PB having a short wavelength, for example, 248 nm, whereas the alignment beam has a considerably longer wavelength, for example, 633 nm. In fact, this system incorporates an extra lens, or correction lens, 25 in the projection column. This lens ensures that the substrate alignment marks are imaged in the plane of the mask alignment marks and with the correct magnification in spite of the fact that the projection lens system is not optimized for the wavelength of the alignment beam. The correction lens is arranged at such a height in the projection column that, on the one hand, the sub-beams of different diffraction orders of the alignment beam, which sub-beams are generated by a substrate alignment mark, are sufficiently separated in the plane of the correction lens so as to be able to influence these sub-beams separately, and, on the other hand, the correction lens has a negligible influence on the projection beam and the image formed therewith of the mask pattern C. The correction lens 25 is preferably arranged in the Fourier plane of the projection lens system. If the correction lens is arranged in a plane in which the chief rays of the alignment beams b and $b_1$, intersect each other, as is shown in FIG. 1A, this lens can be used for correcting the two alignment beams. For further details about the object and operation of the correction lens 25, reference is made to U.S. Pat. No. 5,100,237.

A wedge or another deflection element, such as a diffraction element, is preferably arranged in the proximity of an alignment mark further down the path of the alignment beam(s). With such a deflection element (not shown in FIGS. 1A–1C), alignment errors may be prevented, which result from unintentional phase differences within the selected alignment beam portions captured by the detector 13 or 13', which phase differences may occur if the symmetry axis of the alignment beam portions coming from a substrate alignment mark is not perpendicular to the mask plate, so that false reflections may occur within this plate. An alignment system provided with such a deflection element is described in U.S. Pat. No. 5,481,362.

In addition to the global alignment marks $P_1$ and $P_2$ shown in FIG. 1C, which marks are used for aligning the total substrate with respect to the mask, referred to as global alignment, the substrate may be provided with further alignment marks, for example one mark per IC area, so as to align the relevant area with respect to the mask pattern for each IC area. The mask may have more than two alignment marks, while the further alignment marks may be used, for example, to measure the rotation of the mask about the Z axis so as to correct therefor.

For accurately determining the X and Y positions of the substrate table WT, known projection apparatuses comprise a multi-axis interferometer system. U.S. Pat. No. 4,251,160 describes a two-axis system and U.S. Pat. No. 4,737,283 describes a three-axis system. In FIG. 1A, such an interferometer system is diagrammatically represented by the elements 50, 51, 52 and 53, the Figure showing only one measuring axis, the X axis. The beam $b_4$ emitted by a radiation source 50, for example a laser, is split into a measuring beam $b_{4,m}$ and a reference beam $b_{4,r}$ by a beam splitter 51. The measuring beam reaches a reflecting side face 54 of the substrate holder WH and the measuring beam reflected by this side face is combined by the beam splitter with the reference beam reflected by a stationary reflector 52, for example, a "corner cube" reflector. The intensity of the combined beam can be measured with a detector 53 and the displacement, in this case in the X direction, of the substrate holder WH can be derived from the output signal of this detector, and also an instantaneous position of this holder can be established.

As is diagrammatically shown in FIG. 1A, the interferometer signals, represented by one signal $S_{53}$ for the sake of simplicity, and the signals $S_{13}$ and $S_{13}$, of the alignment system are applied to a signal-processing unit SPU, for example a microcomputer, which processes said signals to control signals $S_{AC}$ for an actuator AC with which the substrate holder is moved in the XY plane via the substrate table WT.

With an interferometer system, which does not only comprise the X measuring axis shown in FIG. 1A but also a Y measuring axis and possibly a third measuring axis, the positions of, and the mutual distances between, the alignment marks $P_1$, $P_2$ and $M_1$, $M_2$ in a system of co-ordinates defined by the stationary interferometer system can be laid down during the initial, or global, alignment of the mask with respect to the substrate. This interferometer system is also used to enable the substrate table to step very accurately, i.e. to move it through predetermined distances and directions. Such a step is performed to position a subsequent IC field under the mask pattern and the projection lens system after the mask pattern has been imaged with one (or more) flash(es) in a first IC area or field, so that the mask pattern can also be imaged in this field. These step and imaging operations continue until all IC fields have been provided with a mask pattern image. A lithographic apparatus operating in this manner is referred to as stepper.

Due to the demand for more electronic components per surface unit of an IC field, on the one hand, and larger IC fields, on the other hand, increasingly stricter requirements are imposed on the resolving power and the image field of the projection lens system. To alleviate these technologically contradictory requirements, it has already been proposed to use a step-and-scanner. In such an apparatus, the same stepping movements as in a stepper are performed, but only a small portion of the mask pattern is imaged on a corresponding sub-field of the IC field when imaging the mask pattern on an IC field. By imaging successive parts of the mask pattern on successive sub-fields of the IC area, an image of the entire mask pattern on an IC field is obtained. To this end, the mask pattern is illuminated with a projection beam which forms a small, for example rectangular or arcuate, illumination spot at the location of the mask pattern, and the substrate table is moved in a given direction, the scan direction, with respect to the projection lens system and the projection beam, and the mask table is moved in the same or the opposite direction, while the rate of the substrate table is M times that of the mask table. M is the magnification with which the mask pattern is imaged. It should be ensured that the mask and the substrate have the correct mutual position at any moment, which can be realized by means of a very accurate synchronization of the movements of the mask and the substrate, i.e. the rate $V_{sub}$ of the substrate is always equal to M times the rate $V_{MA}$ of the mask.

To check the condition $V_{sub}=M.V_{MA}$, the step-and-scanner should not only comprise a substrate interferometer system but also a mask interferometer system with which the movement and the position of the mask can be measured accurately. The measuring mirror of the last-mentioned system is preferably secured to the mask holder. The mask interferometer system is denoted in FIG. 1A by the elements 60, 61, 62, 63 and 64 which have the same function as the elements 50, 51, 52, 53, and 54 of the substrate interferometer system. The mask interferometer system signals, represented by one signal $S_{63}$ for the sake of simplicity in FIG. 1A, are applied to the signal-processing unit SPU in which these signals are compared with the corresponding signals of the substrate interferometer system. It can then be ascertained whether the mask and the substrate have the mutually correct position and/or move synchronously.

To ascertain whether these conditions are fulfilled, it is sufficient that both the interferometer system for the substrate and that for the mask have three measuring axes. However, the substrate interferometer system preferably has five measuring axes. As described in EP-A 0 498 499, not only X, Y and $\phi_{z,w}$ but also $\phi_{x,w}$ and $\phi_{y,w}$, i.e. the tilts of the substrate about the X axis and the Y axis can be measured. For the different embodiments of the interferometer units of which a five-axis interferometer system may be composed, reference is made to EP-A 0 498 499. To be able to measure the tilts about the X axis and the Y axis also for the mask, a five-axis mask interferometer system may be used. However, it is alternatively possible to combine a three-axis mask interferometer system with other sensors, such as capacitive sensors, for measuring the tilts of the mask about the X axis and the Y axis.

Before a substrate can be illuminated in the projection station, the height in the Z direction of the substrate must first be measured with respect to the projection system and possibly adapted so that the mask pattern can always be imaged sharply on the substrate. In known projection apparatuses, an optical focus error detection device is used for this height measurement, which device is present in the projection station and is secured to the projection system. This detection device is described in U.S. Pat. No. 4,356,392.

Moreover, the local tilt of the substrate must be measured. For this purpose, a focus-and-level device which is present in the projection station is used in known apparatuses. Such a device is described in U.S. Pat. No. 5,191,200. The focus-and-level device is rigidly coupled to the projection system because the elements of this device are arranged in a plate which forms part of a measuring frame in which also the projection system is rigidly secured. A coupling is thereby established between the image plane of the projection system and the surface of the substrate holder.

A given space is required for using the focus-and-level device so that the projection system should have such a design that it has a given free working distance, the distance between the last element of this system and the substrate surface. Moreover, problems may occur during measurements with the aid of the focus-and-level device when measuring the so-called edge-dies, i.e. substrate fields located at the edge of the substrate. The measurements on the separate substrate fields require a certain amount of time during which the projection station cannot be used for the actual illumination of the substrate.

These problems can be avoided if the Z positions and the tilts of the substrate fields are measured in a different manner, and if this measurement is largely performed outside the projection station. In analogy with what has already been proposed for aligning the substrate fields with respect to the mask pattern, the projection apparatus may to this end be extended with a Z measuring station and with a second, or more, substrate holder(s).

FIG. 2 shows diagrammatically the mechanical elements of such an extended photolithographic projection apparatus with two substrate holders and a Z measuring station. This apparatus comprises a frame 101 which, viewed in a vertical Z direction, successively comprises a positioning device 103, a mask holder 107 and an illumination unit 108 provided with a radiation source 109. The positioning device 103 comprises a first substrate holder 111 and a second, identical substrate holder 113. A projection lens holder 105 is present between the mask holder and the substrate holder. The substrate holders 111 and 113 comprise a first and a second supporting face 117 and 119 which extend perpendicularly to the Z direction and on which a first substrate 120 and a second substrate 121, respectively, may be arranged. The first and second substrate holders 111 and 113 are movable with respect to the frame 101 in a first direction, parallel to an X direction which is perpendicular to the Z direction, and in a second direction parallel to an Y direction which is perpendicular to the Z direction and the X direction, by means of a first displacement unit 123 and a second displacement unit 125, respectively, of the positioning device 103. The mask holder 107 has a supporting surface 127 which extends perpendicularly to the Z direction and on which a mask 129 can be arranged.

The substrates which must be illuminated are arranged in a magazine which is entered into the apparatus. From this magazine, the substrates are consecutively introduced into the apparatus by means of a transport mechanism. Said magazine and transport mechanism, which are not shown in FIG. 2, are known per se. The Z measuring station is diagrammatically represented in FIG. 2 by a measuring unit 133 which is also secured to the frame 101. In the situation of the apparatus shown in FIG. 2, the first substrate holder 111 is present in the projection station and the first substrate 120 is illuminated via the mask 129 with radiation emitted by the illumination unit 108 and focused by the projection system which is present in the holder 105. Only the optical axis 131 of this projection system is shown. The second substrate holder is present in the measuring station. As will be described hereinafter, the height and the position of the substrate fields are determined in this station and related to the height of a reference plane on the second substrate holder 113. After the illumination of the substrate 120 is finished, the first substrate holder 111 is displaced by the positioning device from the projection station to the meauring station. From this station, the first substrate 120 is moved by said transport mechanism to said magazine. Simultaneously, the second substrate holder is moved from the meauring station to the projection station by the positioning device 103. Since the ideal height and position of the substrate fields in the measuring station is already related to the height of the substrate holder reference plane, only the height of the substrate holder reference plane is to be measured and, if necessary, corrected in the projection station. This measurement and correction is a relatively simple process which can be performed quickly. Since the more difficult and more time-consuming measurement of the height and position of the substrate fields is performed in the measuring station and time-parallel with the illumination of the substrate which is present in the projection station at that instant, the projection station can be used for the illumination itself for a maximum period of time so that a large number of substrates can be illuminated per unit of time.

The principle and advantages of a photolithographic apparatus with two substrate holders and tables are described in, inter alia, EP-A 0 687 957 and in the English-language abstract of JP-A 57-183031 in which also embodiments of such an apparatus are shown.

Figure 3:
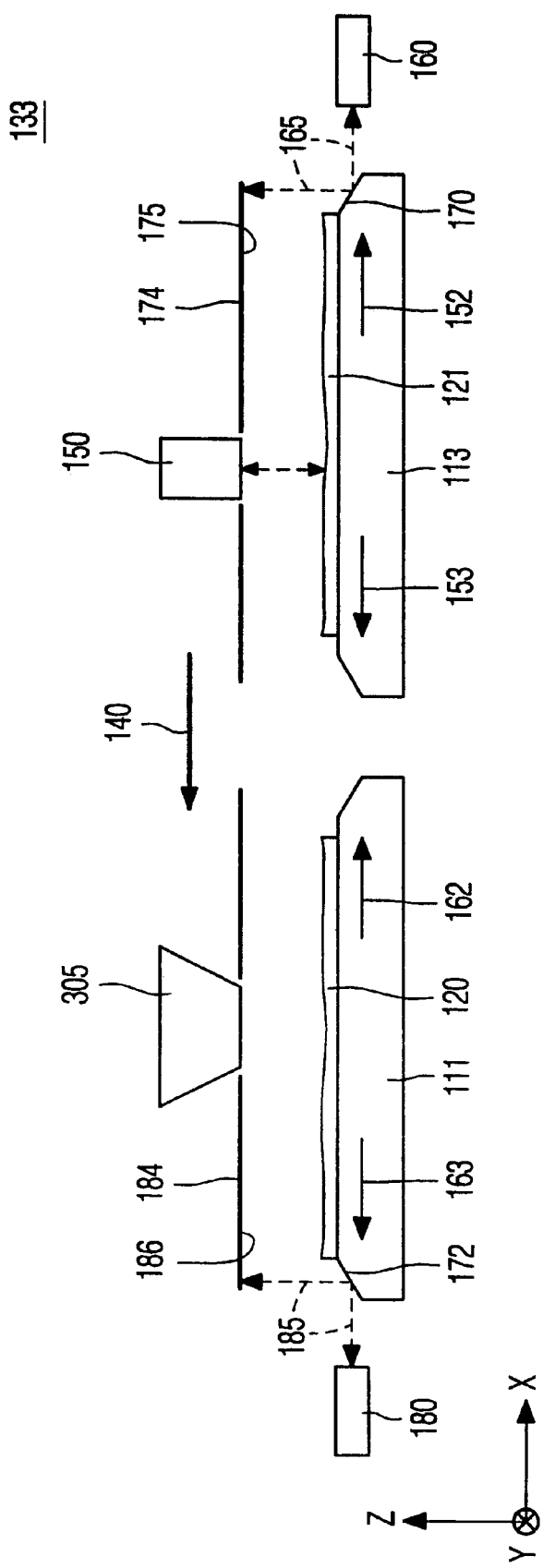
FIG. 3 shows the height sensors used in the projection station and the measuring station.
Figure 4:
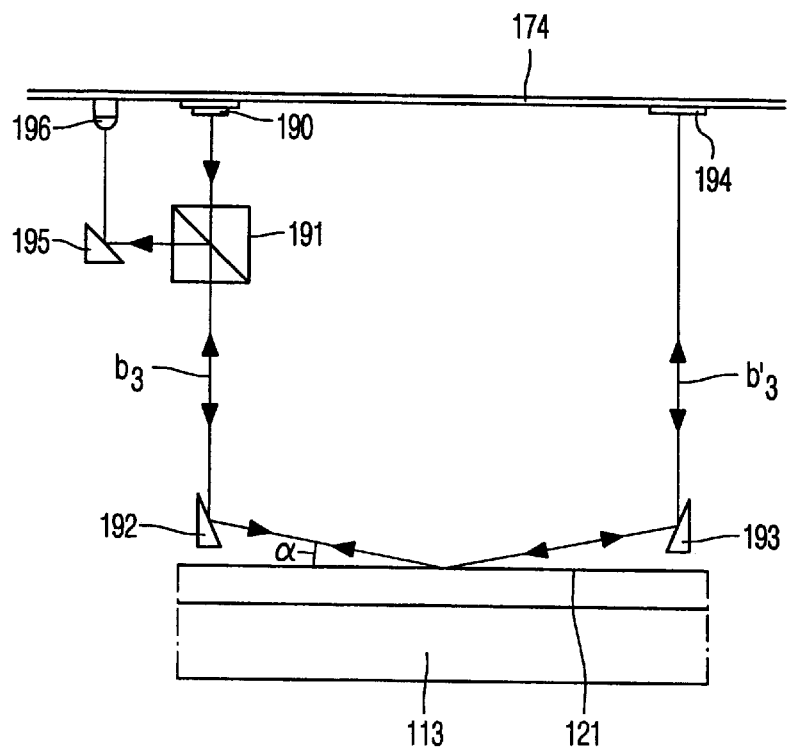
FIG. 4 shows an embodiment of a height sensor for measurements on a substrate.

FIG. 3 shows diagrammatically the method according to the invention for measuring the height and the position of the substrate fields. In this Figure, the elements which correspond to those of FIG. 2 are denoted by the same reference numerals. The righthand part of the Figure shows the measuring station 133 accommodating the second substrate holder 113 with the second substrate 121 at the instant indicated in the Figure. The left-hand part of the Figure shows a small part of the projection station accommodating the first substrate holder 111 with the first substrate 120. The arrow 140 illustrates how the substrates are moved in the projection apparatus. The measuring station 133 comprises a first height sensor 150 shown only diagrammatically, which may be implemented in various known manners. This height sensor may be, for example a capacitive, pneumatic or optical height sensor. An embodiment of an optical height sensor is shown in FIG. 4.

In this Figure, element 190 is a radiation source, for example a diode laser which supplies a measuring beam $b_3$. This beam passes a beam splitter 191 and is reflected by a reflecting prism 192 to the surface of the substrate 121, the beam being incident on the substrate at a very small angle α. The beam reflected by the substrate surface is reflected by a prism 193 to a retroreflector 194. The retroreflector reflects the beam in itself so that this beam once more traverses the same path as beam $b'_3$, via reflections on the prism 193, the substrate surface and the prism 192. The beam splitter 195 and a reflecting prism reflect the measuring beam to a radiation-sensitive detection system 196. This system consists of, for example a position-sensitive detector or of two separate detectors. The position of the radiation spot formed by the beam $b'_3$ on this system is dependent on the height of the portion of the substrate surface on which the measuring beam is incident. For an extensive description of this optical height sensor, reference is made to U.S. Pat. No. 4,356,392 in which such a height sensor is referred to as focus error detection device.

A height sensor which is particularly suitable for measurements on a substrate provided with a photosensitive layer is of the type which also operates with a measuring beam which is obliquely incident on the photosensitive layer but in which this beam has a broad wavelength band. Due to the broadband character of the measuring beam, interferences which may occur in the beam due to multiple reflections on the layers of the assembly of substrate and photosensitive layer will average each other out and will not affect the height-measuring signal. To obtain a sufficiently accurate measuring signal, the path of the measuring beam incorporates a first grating between the radiation source and the substrate, and a second grating between this substrate and the detection system. The first grating is imaged on the second grating via a reflection on the radiation-sensitive layer, and the extent to which the image of the first grating coincides with the second grating is determined by the height of the radiation-sensitive layer. For an extensive description of this height sensor, reference is made to U.S. Pat. No. 5,191,200 in which different embodiments of this height sensor, which is referred to as focus detection system in this patent, are described.

The height sensor 150 measures only a small area of the substrate 121 at any instant. During the height measurement, the substrate holder 113 with the substrate 121 is moved under the height sensor in the Z and Y directions as is illustrated by means of the arrows 152 and 153, so that the local height of this substrate is measured at a large number of points on the substrate. The measured values thus obtained can be processed in known manner such that the ideal height and position can be computed for each substrate field. The measuring station comprises a second height sensor 160, which is also shown only diagrammatically, measuring the height of a reference plane 170 of the substrate holder. This measurement is performed simultaneously with, and as many times as, the height measurement of the substrate. Then, the measured values of the two height sensors can be related to each other, and the height of the reference plane 170 associated with the ideal height and position of the relevant substrate field can be computed for each substrate field. Various embodiments of the second height sensor are also possible. As will hereinafter be explained, this height sensor is preferably implemented as an interferometer and the reference plane is a beveled reflecting face of the substrate holder, which face functions as Z measuring mirror for the interferometer. This face reflects an interferometer measuring beam 165 to a Z reflector 175 which is arranged on a plate 174 coupled to the height sensor 150. The Z reflector reflects the measuring beam to the interferometer again and forms the reference with respect to which the height of the substrate holder is measured.

During the height measurement on the substrate 121 and the substrate holder 113, the substrate 120 is illuminated in the projection station. After this height measurement and illumination have been performed, the substrate holder 111 is removed from the projection station, the substrate 120 is removed from this holder and the holder is provided with a new substrate and then placed in the measuring station 150 where it is measured. Meanwhile, the substrate holder 113 and the substrate have been removed from this station and placed in the projection station. In this station, the substrate holder is moved in the X and Y directions under the projection system 305, as is indicated by the arrows 162 and 163, so that the mask pattern can be projected consecutively on all substrate fields. Before a substrate field is illuminated, it should first be checked whether the substrate holder reference plane 172 is at the height computed in the measuring station 150 and associated with the ideal height of the relevant substrate field. To this end, the projection station is provided with a third height sensor 180. The signal from this height sensor can be used to correct the height of the supporting surface of the substrate holder and hence the height and the position of the relevant substrate field. To this end, for example this signal can be applied to a Z actuator which is present in the substrate holder.

In principle, also the height sensor 180 can be implemented in various ways. However, this height sensor is preferably also a Z interferometer. The measuring beam 185 of this interferometer is reflected by the substrate support reference plane 172 functioning as the Z measuring mirror to a Z reflector 186 which reflects the beam via the Z measuring mirror 172 back to the interferometer. The Z reflector 186 is arranged on a plate 184 which is secured to the projection system 305.

An advantage of the use of a Z interferometer as a height meter for the substrate holder is that this meter can be integrated in the X and Y interferometer system which is already present in the projection station for measuring the X and Y positions of the substrate and the substrate fields. Using only a few extra elements, such as a splitting mirror and a Z detector, it can be ensured that a known interferometer system, such as the system described in EP-A 0 498 499, not only supplies and is able to process X and Y measuring beams but also at least a Z measuring beam.

Simultaneously with the measurement of the height of the substrate and the separate substrate fields, it is also possible to measure the position of the substrate and the substrate field position required for performing the Z measurement according to the invention, the height of which field is measured at that instant, by using a composite XYZ interferometer system also in the Z measuring station. In the projection station, the composite interferometer system may be used to ensure that a substrate field which is about to be illuminated is brought underneath the projection system and positioned at the correct height. The XY measurement, on the one hand, and the Z measurement, on the other hand, performed by a composite interferometer system has also an important synergetic effect. On the one hand, the height, or Z position of the substrate and the substrate fields must be known so as to be able to measure the X and Y positions of this substrate and the substrate fields with great accuracy and, on the other hand, the X and Y positions of the substrate and the substrate fields must be known so as to be able to measure the Z position of this substrate and the substrate fields with great accuracy. Since the composite interferometer supplies information about the X and Y position as well as the Z position, it is thus possible to perform an optimal and rapid measurement.

A further considerable advantage of the use of a composite interferometer system in the measuring station as well as the projection station is that a part of the procedure for aligning the substrate and the substrate fields in the X and Y directions can also take place in the measuring station. For aligning the substrate with respect to the mask pattern, this substrate and the mask are usually provided with alignment marks, and for aligning the separate substrate fields, each substrate field is provided with a separate alignment mark. The extent of alignment is determined by imaging a substrate alignment mark and a mask alignment mark on each other and by detecting whether an alignment mark coincides correctly with the image of the other alignment mark. A position-measuring system, preferably an interferometer system, must be used for measuring the displacements of the substrate and for fixing the positions of the substrate fields in a system of co-ordinates. By providing also the substrate holder with one or more alignment marks and by aligning the substrate alignment marks and the substrate holder alignment marks in the measuring station with respect to a reference alignment mark present in the measuring station, a relation can be established between each substrate alignment mark and the substrate holder alignment mark. It is then only necessary to align the substrate holder alignment mark with respect to the mask alignment mark in the projection system. This is a fairly simple process requiring a short time, whereas the alignment of the marks of the substrate fields is more time-consuming. Since the latter process takes place in the measuring station and time-parallel with the illumination of another substrate, considerable time can be saved, also as regards the alignment.

As already noted, the XYZ interferometer system used for performing the novel method may, in principle, be constructed as described in EP-A 0 498 499, on the condition that the system described therein is extended with at least one Z measuring axis whose measuring beam is directed onto the Z measuring mirror.

As is known, an interferometer not only comprises a measuring beam which is directed onto and reflected by the measuring mirror which is secured to the object on which the measurement must be performed, but also a reference beam which is directed onto and reflected by a stationary reference mirror. For the composite XYZ interferometer system, the X and Y reference mirrors may be arranged in the interferometer units constituting the interferometer system as described in EP-A 0 498 499. Also the reference mirror for a Z measuring beam may be arranged in such a unit. However, the Z reference mirror is preferably formed by an X or Y measuring mirror, as illustrated in FIG. 5.

In this Figure, which relates to the substrate interferometer system of the projection station, the Z reference beam is denoted by $b_{z,1r}$. This beam comes from an interferometer unit 200 which, in addition to two X measuring axes, MAX, 1 and MAX,2, also comprises a Z measuring axis MAX,7, which measuring axis is located as close as possible to the upper face of a substrate holder WH. The Z measuring mirror 260 reflects the Z measuring beam of the measuring axis MAX,7 to a Z reflector 264 which is arranged on a plate 263 which is rigidly secured to the holder LH of the projection system and may form part of a larger metrology frame. The Z reflector reflects the Z measuring beam to the Z measuring mirror 260 which, in its turn, reflects the measuring beam to the interferometer unit 200. This unit accommodates a separate detector for the Z measuring beam. Together with other signals, the output signal of this detector can be processed to a Z measuring signal.

Figure 5:
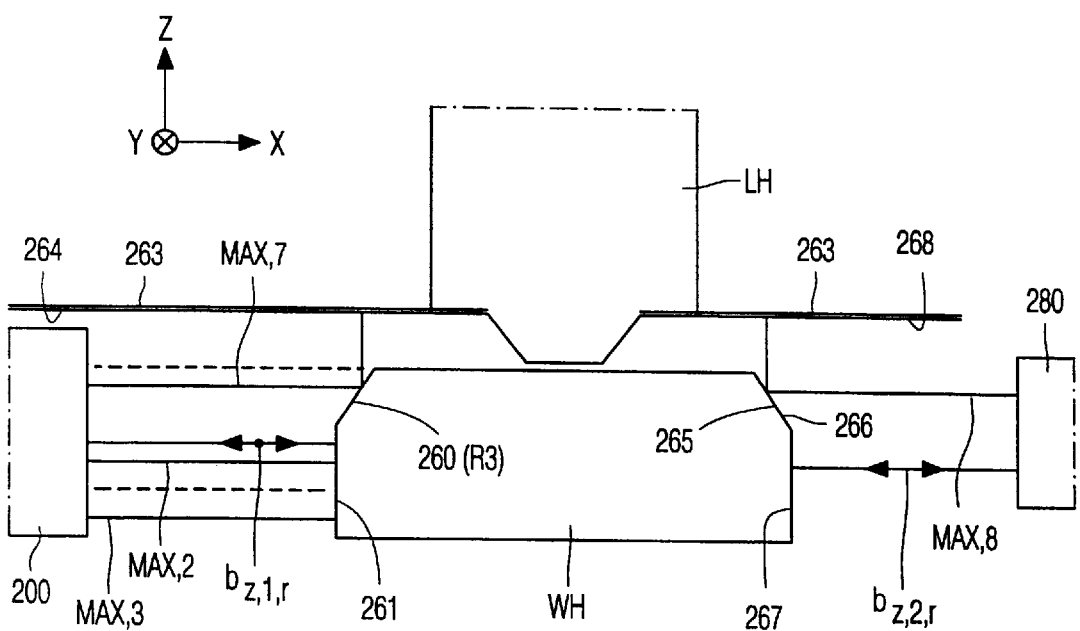
FIGS. 5, 6 and 7 show a first, a second and a third embodiment of a height sensor for a substrate holder for use in both stations, which meter forms part of a composite interferometer system.

The Z measuring mirror 260 in FIG. 5 is arranged at an angle of 45° to the XY plane, the plane in which the X and Y measuring beams propagate. In principle, the Z measuring mirror may also extend at a different acute angle to the XY plane. However, the angle of 45° is preferred because the Z measuring beam traverses the same path to and from the Z reflector 264 and the Z measuring mirror may then have a minimal width.

In this embodiment of the interferometer system, in which the Z measuring beam impinges upon the Z measuring mirror at a position which is proximate to the upper face of the substrate holder, and hence proximate to the substrate, possible tilts of the substrate have a negligible influence on the Z measuring signal.

The X measuring mirror is used as a reference mirror for the Z measurement, as is shown in FIG. 5. The reference beam $b_{z,1r}$ reflected by this mirror then does not only comprise Z position information but also X position information so that the combination on the Z detector of this reference beam with the Z measuring beam results in the output signal of this detector being a pure Z position signal. Thus, an optical differentiation is performed. Instead of using the X measuring mirror 261 as a reference mirror for the Z measurement, it is also possible to arrange a reference mirror for the Z measurement in the interferometer unit 200. The signal which is then supplied by the Z detector does not contain pure Z position information, but the Z position information in that signal is mixed with X position information. For obtaining a pure Z position signal, the X position information must be removed from the detector signal, hence subtracted from this signal. In other words, an electronic differentiation must be used. Particularly if the substrate holder must be moved at great speeds and accelerations, which is desirable in lithographic apparatuses, the rate at which the electronic circuits associated with the interferometer system can process the measuring signals may be a restrictive factor. There is no such restriction when an optical differentiation is used. The optical differentiation, i.e. the use of an X or Y measuring mirror as a reference mirror for the Z measurement, can be used in all embodiments of the XYZ interferometer system.

As is also illustrated in FIG. 5, the interferometer system may be implemented in such a way that two Z measurements can be performed therewith.

To this end, the side face 265 of the substrate holder WH opposite the first Z measuring mirror 260 is also beveled and provided with a second Z measuring mirror. This mirror co-operates with a second Z measuring beam which extends along the Z measuring axis MAX,8. The second Z measuring beam is reflected by the measuring mirror to a second Z reflector 268 which is arranged on the lower side of the plate 263. The second Z measuring beam is reflected by the Z reflector 268 to the measuring mirror which, in its turn, reflects the measuring beam to a detector associated with the measuring axis MAX,8. By adding the signals supplied by the measuring axes MAX,7 and MAX,8, the average Z position of the substrate can be determined. The value for the Z position thus obtained is independent of the X position of the substrate holder.

With the embodiment shown in FIG. 5, a signal which is indicative of a tilt of the substrate about the Y axis can also be obtained. This signal is proportional to the difference of the signals supplied by the MAX,7 and MAX,8 measuring axes.

Figure 6:
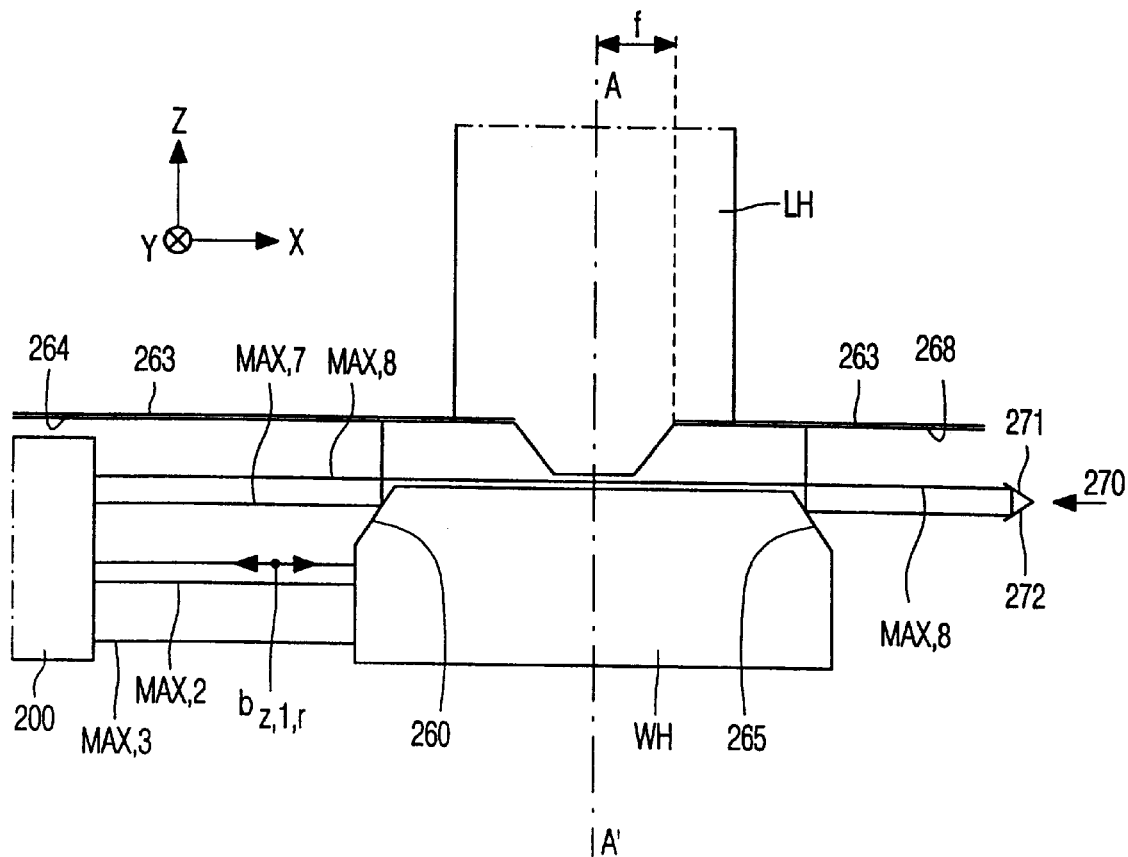

In the embodiment of FIG. 5, a separate interferometer unit 280 is required which is provided with an extra radiation source and accommodates the second Z detector. FIG. 6 shows an embodiment of the interferometer system in which no extra interferometer unit is required. In this embodiment, the measuring beam for the MAX,8 measuring axis is supplied by the interferometer unit 200 which also comprises the second Z detector. The measuring beam for the MAX,8 measuring axis traverses the space between the substrate and the projection lens and is reflected by a roof reflector 270 with two reflecting faces 271 and 272 to the Z measuring mirror 265. The mirror 265 reflects the measuring beam to the Z reflector 268 which, in its turn, reflects the measuring beam to the measuring mirror 265, whereafter this beam traverses the reverse path to the detector unit 200. In this unit, the measuring beam is received by the aforementioned second detector.

The Z measuring mirrors 260 and 265 extend in the Y direction, the direction perpendicular to the plane of the drawing of FIGS. 5 and 6 throughout the length of the substrate holder. If the lithographic apparatus is a step-and-scanner, the Y direction is the scanning direction so that the Z measurement can be performed throughout the scanning length.

In principle, the width of the Z measuring mirrors is equal to the diameter of the cross-section of the Z measuring beam at the area of this mirror, or is slightly larger if this beam traverses the path to the Z reflector twice. This means that this width can be limited and the surface of the Z measuring mirror can remain small. Due to their small total surface, the measuring mirrors can be manufactured in practice with the desired surface accuracy.

Figure 7:
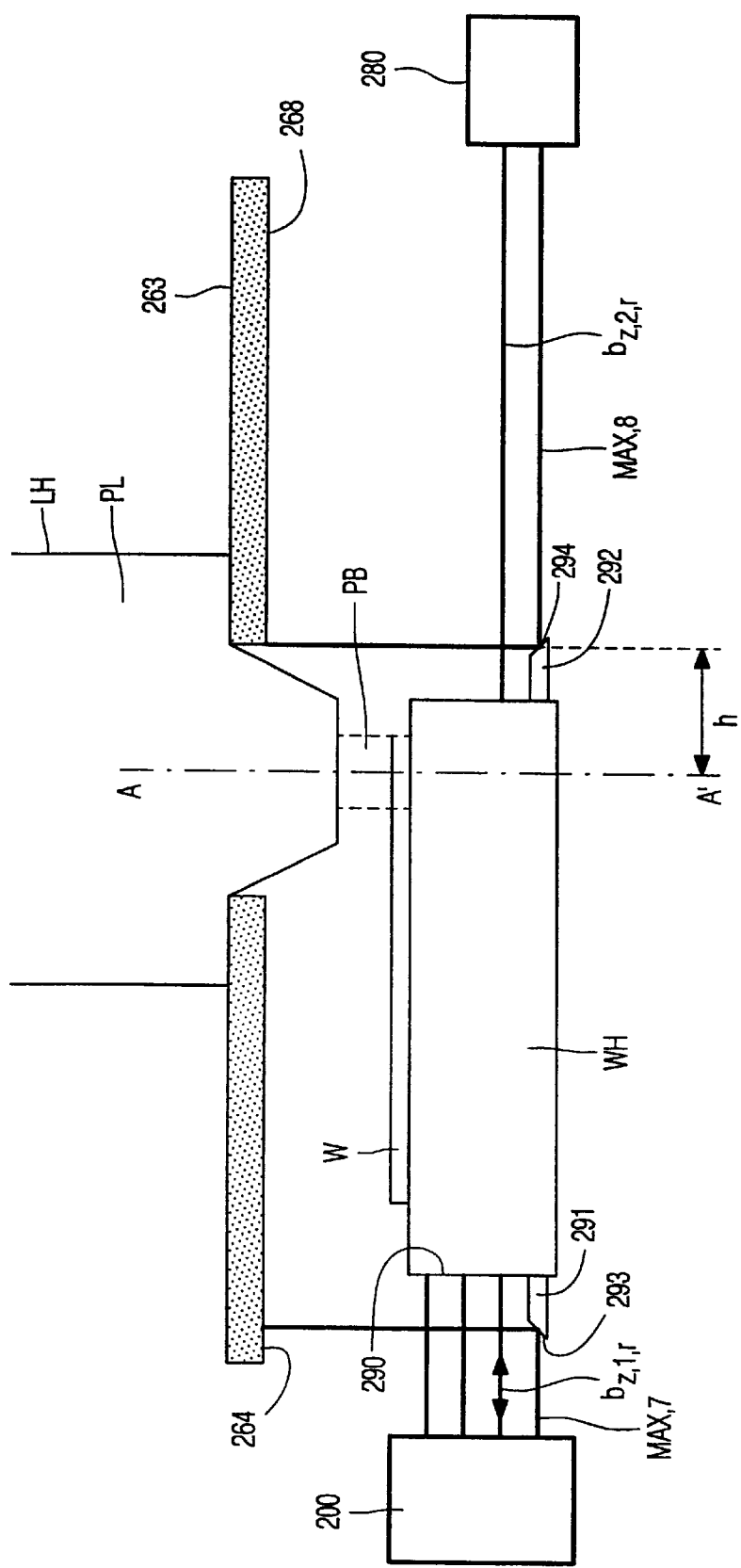

As is shown in FIG. 6, there is a given distance f between the principal axis AA' of the projection lens system PL and the end of the Z reflector 268. This distance is, for example of the order of 70 mm. In order that a Z measurement can also be performed in an extreme X position of the substrate holder WH, in which the extreme right portion of the substrate is illuminated, as is indicated in FIG. 7, the distance h between the axis AA' and the measuring mirror 265 should be at least equal to the distance f for that position. This may mean that, for the purpose of the Z measurement, the width of the substrate holder in the X direction should be increased by a given value. If, in addition to a Z measurement via the MAX,8 measuring axis, also a Z measurement via the MAX,7 measuring axis is performed, the width of the substrate holder should be increased by twice this value. Since the substrate holder should also have a given height in order that both the Z measuring mirror(s) and the X and Y measuring mirrors can be arranged on its side faces, a larger dimension in the X direction will considerably increase the weight of the holder. This is less desirable because of the required drive forces for the holder and stability requirements. A Z measuring mirror is therefore preferably arranged on a bar-shaped element having a beveled side face, which element is rigidly connected to the substrate holder.

FIG. 7 shows an embodiment of the interferometer system in which the two Z measuring mirrors 293 and 294 are arranged on bar-shaped elements 291, 292. Now, the required width for a measuring mirror is also equal to or slightly larger than the diameter of the cross-section of the measuring beam at the area of this mirror so that the dimension in the Z direction of the bar-shaped element can be limited. The extra weight added to the substrate holder to render it suitable for performing the described Z measurement is thereby limited. As is shown in FIG. 7, the two Z measuring mirrors are arranged on the lower part of the substrate holder. Consequently, the X measuring axes associated with the interferometer unit 200 can be positioned proximate to the upper face of the substrate holder so that the risk of Abbe errors for these measuring axes can be reduced. Moreover, a maximal portion of the side faces of the substrate holder and a maximal space between the projection system and the substrate holder are then available for performing measurements other than the measurements described and being irrelevant to the present invention.

FIG. 7 also shows the projection beam PB. In the case of a step-and-scanning lithographic apparatus, this beam has an oblong, for example rectangular, cross-section at the area of the substrate, whose longitudinal direction is parallel to the X direction. Upon each image of the mask pattern on a substrate field, this beam is moved in the Y direction across the substrate by moving the mask and the substrate in the Y direction with respect to the projection beam and the projection lens system.

An EP patent application No. 97203771.7, priority to corresponding U.S. application Ser. No. 09/114,747 and international publication No. WO 99/28790 recently filed in the name of the Applicant arid published prior to or simultaneously with the present patent application describes various embodiments of a composite interferometer system with a Z measuring axis for an application other than for the implementation of the method in accordance with the present invention. These embodiments of the interferometer system with a plurality of X and/or Y measuring axes may also be used for performing the method in accordance with the present invention. An interferometer system is preferred in which not only at least a Z measuring axis but also at least five other X and Y measuring axes are used because not only the X and Y position and the rotation about the Z axis but also the tilts of the substrate about the X axis and the Y axis can be measured therewith. By referring to the prior patent application, it is herein incorporated by reference so that it is not necessary to further describe the constructive details of the embodiments of the interferometer system.

The path of a Z measuring beam which returns from the Z reflector and the Z measuring mirror may incorporate, between this Z measuring mirror and the interferometer with which this beam is associated, a retroreflector which reflects this measuring beam again to the Z measuring mirror and the Z reflector. As a result, extra reflections of the measuring beam occur on the Z measuring mirror and the Z reflector so that it is achieved that the original direction of the measuring beam is maintained when possible tilts of the mirrors which are present in the path of this measuring beam occur. Thus, the influence of a beam walk-off on the Z measuring signal can be reduced considerably. An embodiment of the interferometer system with a retroreflector in the path of the Z measuring beam is also described in the above-mentioned prior patent application.

In view of the required accuracy of the composite interferometer system for a lithographic apparatus, changes of ambient parameters, such as temperature, air pressure, humidity may start playing a role. These changes cause a variation of the refractive index of the medium in which the interferometer beams propagate. Such a variation may also be caused by turbulences in the medium. To be able to determine these variations, so that they can be corrected, the interferometer system may be provided with an extra measuring axis, a reference measuring axis, which co-operates with a stationary reflector. The measuring beam of the reference axis traverses a constant geometrical path length. The optical path length, which is the product of the geometrical path length and the refractive index of the traversed medium, is, however, influenced by a variation of the refractive index. This variation thus also influences the differences between the path lengths traversed by the reference axis measuring beam and the associated reference beam. This difference is measured by means of an extra, reference, detector in the interferometer unit with which the reference measuring axis is associated. The output signal of this detector can be used to correct the information obtained via other measuring axes for refractive index variations due to turbulences or variations of the ambient parameters.

Refractive index variations may also be measured by means of two measuring beams which have considerably different wavelengths, for example, different by a factor of two, and traverse the same path within the medium in which the interferometer beams propagate. Since the refractive index for a beam is dependent on the wavelength of this beam, the optical path lengths for these beams are different despite the equal geometrical path lengths for the beams, so that these beams have a phase difference upon arrival at a detector. In the case of refractive index variations, there are also variations of this phase difference, so that a signal which is indicative of the refractive index variation is obtained.

To ensure that the mask and the substrate are positioned with respect to each other in an extremely accurate manner in a lithographic apparatus having a high feed-through rate for the substrates during illumination of the IC areas, it should be prevented that forces of the actuators for the substrate holder and the mask holder are transferred to components of the interferometer system for the substrate holder and, in the case of a step-and-scanner, to the interferometer system for the mask holder. To this end, the components of the interferometer system(s), with the exception of the measuring mirrors, may be arranged in a rigid frame in which also the projection system is rigidly secured, which frame is suspended dynamically isolated from the other components of the apparatus. The interferometer components are now rigidly coupled free from disturbance to the projection system. Since said frame, also referred to as metrology frame, is suspended dynamically isolated or free from vibrations in the apparatus, the positions of the interferometer components present therein are no longer affected by external forces such as the drive forces for the substrate table and the mask table.

Figure 8:
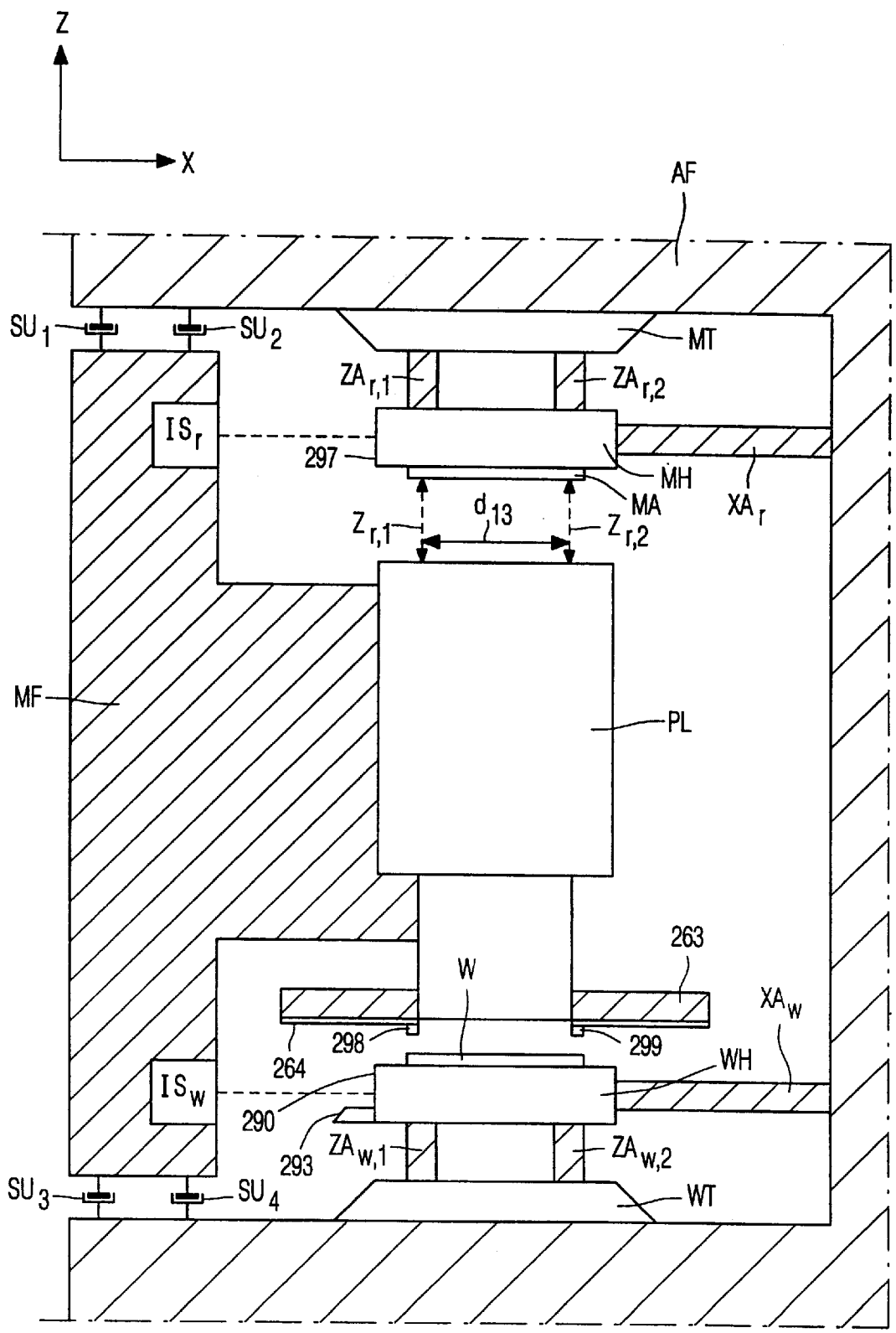
FIG. 8 shows an embodiment of a projection station with a metrology frame.

FIG. 8 shows diagrammatically a step-and-scanning optical lithographic apparatus provided with a metrology frame. Such an apparatus not only comprises an interferometer system ISW for the substrate, but also an interferometer system ISM for measuring the X and Y displacements of the mask. Since these interferometer systems and the projection system PL are arranged in a metrology frame MF, these systems are rigidly fixed with respect to each other, and the image of the mask pattern formed by the projection system is coupled to the interferometer systems.

Since the measuring mirrors 290 and 293 of the substrate interferometer system and the measuring mirror 297 of the mask interferometer system are part of the substrate holder WH and the mask holder MH, respectively, on which the substrate and the mask are rigidly fixed, the movements of the substrate and the mask are directly measured with these systems. Consequently, these movements and the mask pattern image formed are not affected by movements of other components of the apparatus, such as actuators for adjusting the mutual position of the substrate and the mask along the Z axis.

The actuators for displacing the mask and the substrate in the X and Y directions, of which only the X actuators $XA_w$ and $XA_r$ are illustrated by way of rods in FIG. 8, form part of an actuator frame AF.

The metrology frame is suspended in the actuator frame by means of diagrammatically shown dynamic isolators $SU_1$, $SU_2$, $SU_3$ and $SU_4$ so that this frame is dynamically decoupled from the rest of the apparatus. The mask table MT and the substrate table WT are arranged in the actuator frame. The substrate table has three Z actuators, two of which, $ZA_{w,1}$ and $ZA_{w,2}$ are shown, with which the Z position of the substrate can be adjusted by equal energization of the three actuators, or with which a tilt of the substrate can be realized by unequal energization of the three actuators. These movements can be realized also for the mask in an analogous manner if the mask table is also provided with three Z actuators, two of which, $ZA_{r,1}$ and $ZA_{r,2}$, are shown.

The plate 263, which is rigidly secured to the lower part of the projection lens holder, is present in the metrology frame. As already described, the reflecting lower side 264 of this plate constitutes the Z reflector for the Z measuring axis of the interferometer system ISW.

The construction shown in FIG. 8 with a metrology frame and an actuator frame may also be used in a lithographic apparatus of the stepping type in which a Z measurement is performed in accordance with the invention. Such an apparatus does not comprise a mask interferometer system.

Strict requirements with respect to rigidity and stability must be imposed on the metrology frame, and the material of this frame must have a very small temperature coefficient of expansion. However, these requirements may be alleviated if the reference mirrors for the X and Y measuring axes of the substrate interferometer system and possibly of the mask interferometer system are secured to the holder of the projection lens system PL or on the metrology plate 263. The interferometer systems and the projection lens system are then optically coupled and mutual movements can no longer affect the measurements. This facility is diagrammatically shown in FIG. 8 with the two reference mirrors 298 and 299 under the plate 263. The reference beams may be guided from the substrate interferometer system to these reference mirror via reflectors (not shown). Also for the mask interferometer system, the reference mirrors may be secured to the holder of the projection lens system.

It is to be noted explicitly that, also in a lithographic projection apparatus without a metrology frame, the X and Y reference mirrors of the substrate interferometer system, and possibly of the mask interferometer system, may be secured to the holder of the projection lens system so as to obtain the same advantages. A photolithographic projection apparatus provided with multi-axis interferometer systems, but without the Z measuring axis, in which the reference mirrors are secured to the holder of the projection lens system is known per se and described in PCT WO 97/33205.

FIGS. 9A–9C are a survey of the interferometer measurements which, in a given embodiment of a lithographic apparatus suitable for performing the method according to the invention, are performed in the projection station and the measuring station. These figures show the two substrate holders 111 and 113 with the X measuring mirrors $R_1$, $R'_1$, Y measuring mirrors $R_2$ and $R'_2$ and Z measuring mirrors $R_{3,1}$, $R_{3,2}$, $R'_{3,1}$, $R'_{3,2}$. FIG. 9A is a cross-section taken on the XY plane, FIG. 9B is a cross-section taken on the XZ plane, and FIG. 9C is a cross-section taken on the YZ plane. The reference numerals 300 and 310 denote the measuring area of the illumination station and that of the alignment station. Each measuring axis is indicated by two letters and one numeral. The first letter indicates the direction (X, Y or Z) in which the measurement is performed with the relevant measuring axis, the numeral shows the number of the measuring axis in this direction, and the second letter indicates whether the measurement takes place in the alignment station (M) or the illumination station (E). In the embodiment of FIGS. 9A–9C, the measurements are performed along three measuring axes both in the X direction and in the Y direction, and two Z measurements are performed. The interferometer unit 330 is used for the Y measurements in the projection station. The corresponding interferometer units for the projection station and the measuring station are denoted by the same reference numerals, but the reference numerals for the interferometer units in the measuring station are primed.

Figure 10D:
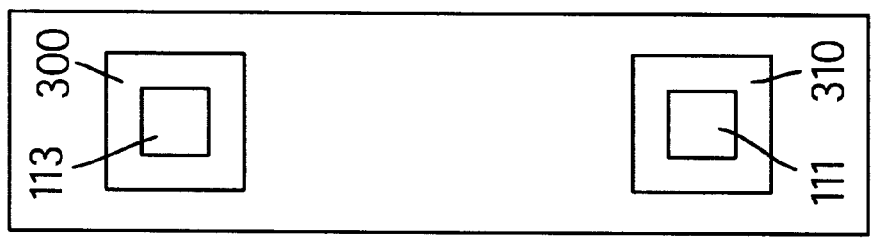
FIGS. 10A–10D illustrate the movements performed by the substrate holders in the apparatus of FIG. 2.
Figure 10C:
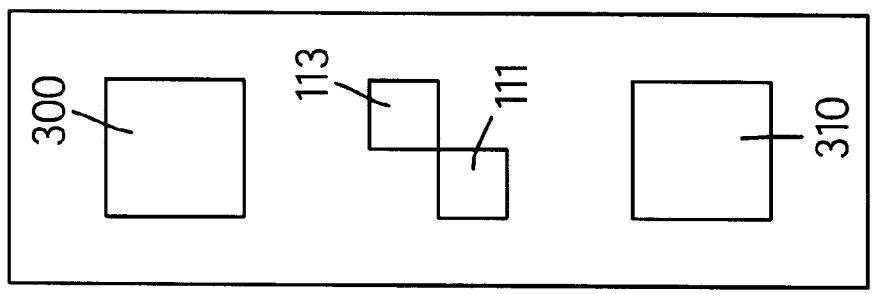
Figure 10B:
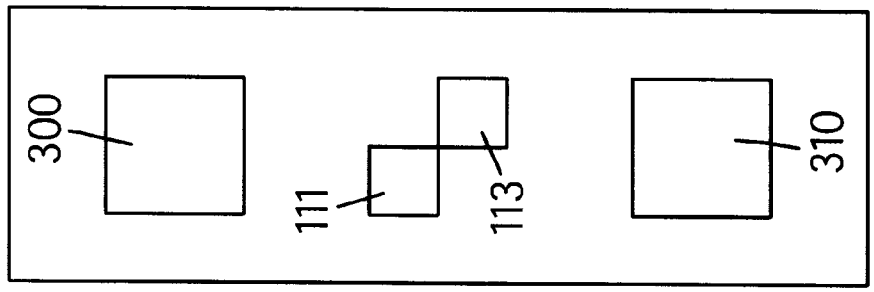
Figure 10A:
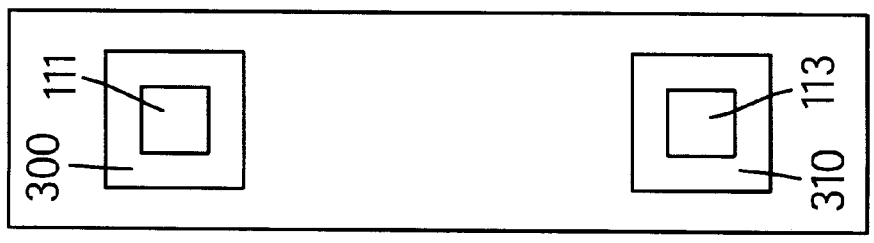

In order that the two substrate tables and associated holders are moved from the measuring station to the projection station, and vice versa, in a lithographic apparatus, the two substrate tables may be secured to a common rotatable arm during this movement so that the substrates can be brought to the measuring station or the projection station via a common rotation. However, for performing these movements from and to the stations, the substrate tables are preferably driven separately in such a way that they make rectilinear movements in the XY plane. FIGS. 10A–10D show how the substrate holders 111 and 113 and the associated tables (not shown) move with respect to the projection station 300 and the measuring station 310 in that case. In these figures, four different situations are denoted by FIG. 10A, FIG. 10B, FIG. 10C, and FIG. 10D from left to right. In FIG. 10A, the substrate holder 111 is present in the projection station 300 and the substrate present on this holder is illuminated, while the substrate holder 113 is present in the measuring station 310 and the substrate in this holder is measured. In FIG. 10B, the illumination process and the measuring process have been completed, and the two substrate holders have left the relevant station. In FIG. 10C, the two substrate holders have passed each other, and substrate holder 111 is on its way to the measuring station 310 and substrate holder 113 is on its way to the projection station 300. In FIG. 10D, substrate holder 113 is positioned in the projection station 300 so that the substrate present on this holder can be illuminated, while the substrate holder 111, after removal of the first substrate and provided with a new substrate, is positioned in the measuring station 310 so that a measurement can be performed on this substrate.

The novel method of measuring the height and position of substrate fields has been described with reference to a photolithographic apparatus for manufacturing IC structures. However, this method may also be used in photolithographic apparatuses for manufacturing other structures such as structures for integrated or planar optical systems, guidance and detection patterns of magnetic domain memories, or structures of liquid crystalline display panels. The method may also be used in other lithographic apparatuses in which radiation other than optical radiation such as ion radiation, electron radiation or X-ray radiation is used for imaging a mask pattern, either or not with reduction, on a substrate. The image may not only be an image formed by a projection system, but also a proximity image.

What is claimed is:

1. A method of projecting a mask pattern on a plurality of substrate fields of a substrate provided with a radiation-sensitive layer, by a projection beam and a projection system, wherein prior to introducing a substrate holder with the substrate into the projection beam and underneath the projection system, a surface profile of the substrate is determined for each substrate field, the method comprising:

measuring a height of the substrate field in a direction parallel to an axis of the projection beam while moving at least one of a first height sensor and said substrate field with respect to the other in a direction perpendicular to the axis of the projection beam;

measuring a height of a reference plane of the substrate holder with a second height sensor separate from the first height sensor;

establishing a relation between the height of the substrate field and the height of the reference plane of the substrate holder and determnining an ideal height of the reference plane of the substrate holder based on an ideal height of the substrate field;

storing the ideal height of the reference plane of the substrate holder for the substrate field in memory; and after the substrate has been introduced into the projection beam, determining the height of the reference plane of the substrate holder for each substrate field by using a third height sensor separate from the first and second height sensors, and adjusting the height of the substrate holder based upon such determination and the stored ideal height of the reference plane of the substrate holder for each substrate field.

2. The method as claimed in claim 1, wherein for each substrate field, the height of the substrate field and the height of the reference plane of the substrate holder are measured simultaneously.

3. The method as claimed in claim 1, wherein both before and after introducing the substrate holder with the substrate into the projection beam, and when measuring the height of the reference plane of the substrate holder, a position of the substrate is measured along an X axis and a Y axis, the X axis and the Y axis being axes of a three-axis orthogonal system of coordinates, a Z axis of which is parallel to the axis of the projection beam.

4. The method as claimed in claim 3, wherein before introducing the substrate holder with the substrate into the projection beam, an alignment relation is determined for each substrate field between an alignment mark associated with said substrate field and at least one reference mark on the substrate holder, and wherein after introducing the substrate holder with the substrate into the projection beam, each substrate field is aligned before being illuminated, while using the alignment relation and by aligning the reference mark with a corresponding mark on the mask.

5. A product manufactured by a lithography technique using a method of projecting a mask pattern on a plurality of substrate fields of a substrate provided with a radiation-sensitive layer, by a projection beam and a projection system, wherein prior to introducing a substrate holder with the substrate into the projection beam and underneath the projection system, a surface profile of the substrate is determined for each substrate field, the method comprising:

measuring a height of the substrate field in a direction parallel to an axis of the projection beam while moving at least one of a first height sensor and said substrate field with respect to the other in a direction perpendicular to the axis of the projection beam;

measuring a height of a reference plane of the substrate holder with a second height sensor separate from the first height sensor;

establishing a relation between the height of the substrate field and the height of the reference plane of the substrate holder and determining an ideal height of the reference plane of the substrate holder based on an ideal height of the substrate field;

storing the ideal height of the reference plane of the substrate holder for the substrate field in memory; and after the substrate has been introduced into the projection beam, determining the height of the reference plane of the substrate holder for each substrate field by using a third height sensor separate from the first and second height sensors, and adjusting the height of the substrate holder based upon such determination and the stored ideal height of the reference plane of the substrate holder for each substrate field.

6. A lithographic projection apparatus suitable for performing a method of projecting a mask pattern on a plurality of substrate fields of a substrate provided with a radiation-sensitive layer, by a projection beam and a projection system, wherein prior to introducing a substrate holder with the substrate into the projection beam and underneath the projection system, a surface profile of the substrate is determined for each substrate field, said apparatus comprising:

a measuring station for measuring a height of each substrate field and a height of a reference plane of the substrate holder, the measuring station comprising a first height sensor and a separate second height sensor, the first height sensor measuring said height of each substrate field in a direction parallel to an axis of the projection beam, the second height sensor measuring said height of the reference plane of the substrate holder;

means for establishing a relation between the height of the substrate field and the height of the reference plane of the substrate holder and determining an ideal height of the reference plane of the substrate holder based on an ideal height of the substrate field;

a memory for storing the ideal height of the reference plane of the substrate holder for each substrate field; and a projection station for projecting a mask pattern on the plurality of substrate fields of the substrate arranged on the substrate holder, the projection station comprising a third height sensor for measuring the height of the reference plane of the substrate holder after the substrate has been introduced into the projection beam, the third height sensor being separate from the first and second height sensors, wherein the height of the substrate holder is adjusted based upon the measurement by the third height sensor and the stored ideal height of the reference plane of the substrate holder for each substrate field.

7. The lithographic projection apparatus as claimed in claim 6, wherein the measuring station includes an optical alignment system, the optical alignment system including a plurality of elements for imaging alignment marks associated with the substrate fields, and at least one substrate holder alignment mark on a reference mark within the alignment system.

8. The lithographic projection apparatus as claimed in claim 6, wherein the three height sensors are optical height sensors.

9. The lithographic projection apparatus as claimed in claim 8, wherein at least one of the second and third height sensors forms part of a separate composite XYZ interferometer system for measuring X and Y displacements and positions of the substrate, and has a number of X and Y measuring axes, the number of X and Y measuring axes being at least equal to a number of substrate displacements to be determined interferometrically, said measuring axes co-operating with X and Y measuring mirrors arranged on the substrate holder, said interferometer system including a Z measuring axis which co-operates with a Z measuring mirror, the Z measuring mirror being arranged on the substrate holder at an acute angle to the XY plane, said Z measuring axis and Z measuring mirror, the Z measuring mirror together with a Z reflector and a Z detector forming the height sensor.

10. The lithographic projection apparatus as claimed in claim 9, wherein the Z measuring mirror for the interferometer system is arranged on the substrate holder at an angle of substantially 45° to the XY plane.

11. A The lithographic projection apparatus as claimed in claim 9, wherein the Z measuring mirror for the interferometer system is formed by a beveled portion of an X or Y measuring mirror.

12. The lithographic projection apparatus as claimed in claim 9, wherein the Z measuring mirror for the interferometer system is formed by a beveled bar arranged on a side face of the substrate holder, wherein an X or Y measuring mirror is also arranged on the side face of the substrate holder, said bar extending in the Z direction through only a small part of said side face and, in the direction perpendicular thereto, through the side face.

13. The lithographic projection apparatus as claimed in claim 12, wherein the Z measuring mirror for the interferometer system is arranged on a part of the substrate holder remote from the substrate.

14. The lithographic projection apparatus as claimed in claim 9, wherein a reference mirror for a reference mirror for a reference beam associated with the Z measuring beam is formed by an X or Y measuring mirror which is arranged on the side face of the substrate holder, and wherein the Z measuring mirror is also arranged on the side face of the substrate holder.

15. The lithographic projection apparatus as claimed in claim 9, wherein the path of the Z measuring beam incorporates a retroreflector by which the Z measuring beam reflected by the Z measuring mirror and directed to the Z detector is reflected to the measuring mirror for further reflection on the measuring mirror.

16. The lithographic projection apparatus as claimed in claim 9, wherein, in addition to a Z measuring axis, the interferometer system includes at least five further measuring axes.

17. The lithographic projection apparatus as claimed in claim 9, wherein the interferometer system has a measuring axis along which two measuring beams of different wavelengths propagate.

18. The lithographic projection apparatus as claimed in claim 9, wherein, with the exception of the measuring mirrors, the components of the projection station-interferometer system as well as the Z reflector are arranged in a rigid frame in which a projection system is rigidly secured, the rigid frame being suspended dynamically, isolated from other components of the apparatus.

19. The lithographic projection apparatus as claimed in claim 9, wherein the reference mirrors for the reference beams associated with the X and Y measuring beams are arranged on the holder of the projection system.

* * * * *